(12) United States Patent
McQuade

(10) Patent No.: US 8,264,248 B2
(45) Date of Patent: Sep. 11, 2012

(54) MICRO PROBE ASSEMBLY

(75) Inventor: Francis T McQuade, San Jose, CA (US)

(73) Assignee: DSL Labs, Inc., Fremont, CA (US)

( * ) Notice: Subject to any disclaimer, the term of this patent is extended or adjusted under 35 U.S.C. 154(b) by 0 days.

(21) Appl. No.: 11/731,453

(22) Filed: Mar. 30, 2007

(65) Prior Publication Data
US 2008/0238408 A1 Oct. 2, 2008

(51) Int. Cl.
*G01R 31/00* (2006.01)
*G01R 1/067* (2006.01)

(52) U.S. Cl. .......... 324/755.06; 324/756.03; 324/756.01

(58) Field of Classification Search .................. None
See application file for complete search history.

(56) References Cited

U.S. PATENT DOCUMENTS

| | | | | |
|---|---|---|---|---|
| 4,027,935 A * | 6/1977 | Byrnes et al. | .................. | 439/289 |
| 4,774,462 A * | 9/1988 | Black | .................. | 324/758 |
| 4,963,822 A * | 10/1990 | Prokopp | .................. | 324/758 |
| 5,320,559 A * | 6/1994 | Uratsuji et al. | .................. | 439/482 |
| 5,416,429 A | 5/1995 | McQuade et al. | | |
| 5,952,843 A * | 9/1999 | Vinh | .................. | 324/761 |
| 5,977,787 A * | 11/1999 | Das et al. | .................. | 324/761 |
| 6,100,708 A * | 8/2000 | Mizuta | .................. | 324/762 |
| 6,160,412 A | 12/2000 | Martel et al. | | |
| 6,297,657 B1 | 10/2001 | Thiessen et al. | | |
| 6,566,898 B2 | 5/2003 | Thiessen et al. | | |
| 6,633,175 B1 | 10/2003 | Evans et al. | | |
| 6,661,244 B2 | 12/2003 | McQuade et al. | | |
| 6,788,085 B2 * | 9/2004 | Notohardjono et al. | ...... | 324/761 |
| 6,896,546 B2 * | 5/2005 | Ichihara et al. | .................. | 439/526 |
| 6,906,540 B2 | 6/2005 | McQuade et al. | | |
| 6,977,515 B2 | 12/2005 | McQuade et al. | | |
| 7,119,561 B2 * | 10/2006 | Sato | .................. | 324/754 |

* cited by examiner

*Primary Examiner* — Paresh Patel

(74) *Attorney, Agent, or Firm* — Antony P. Ng; Yudell Isidore Ng Russell PLLC

(57) ABSTRACT

Embodiments of the present invention improve probes and probe assemblies. In one embodiment, the present invention includes a probe test head comprising a plurality of novel probes inserted in an array of holes in upper and lower dies of the assembly. The novel assembly includes a novel alignment layer for easy repair and maintenance of the probes.

5 Claims, 10 Drawing Sheets

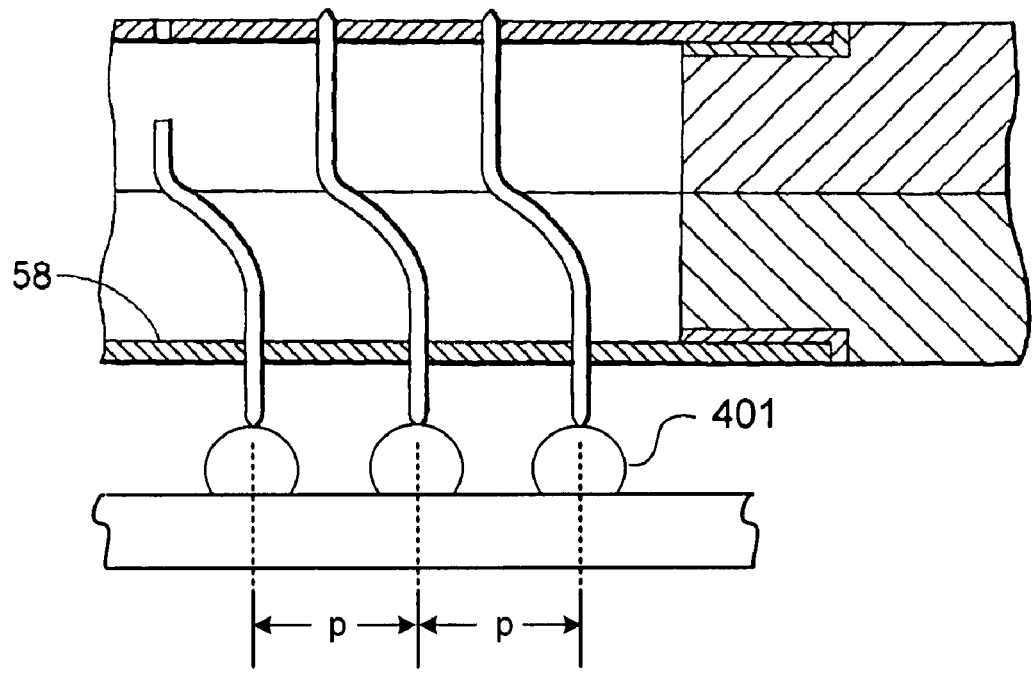
Fig. 4
Prior Art
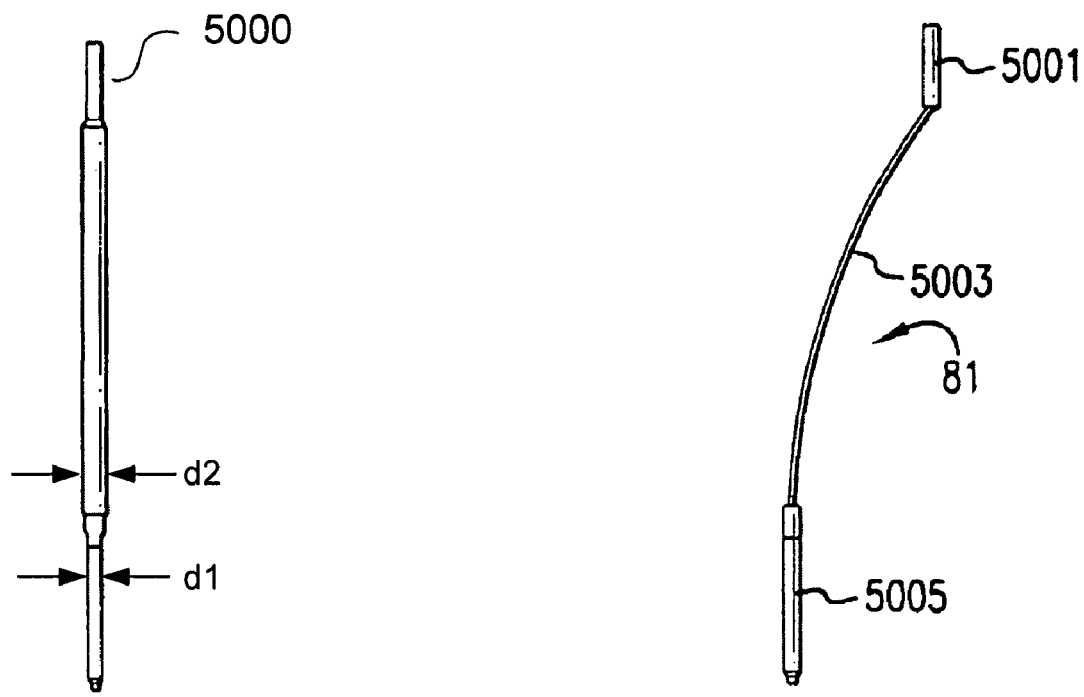
Fig. 5B
Prior Art
Fig. 5A
Prior Art

MICRO PROBE ASSEMBLY

BACKGROUND

The present invention relates to probes, and more particularly, to a micro probe apparatus and probe assembly.

Probe technology is used in a wide variety of applications. Typically, in many situations it is necessary to establish an electrical connection to an electronic circuit wherein the contact is very small. Probes, sometimes referred to as "micro probes" are typically used to establish such connections. A common example of the use of probe technology is in the testing of integrated circuits. When an integrated circuit is manufactured, the many repetitions of the same circuit are commonly included as an array on a silicon wafer. It is generally desirable to test the circuits on the wafer before the wafer is cut and the individual circuits are packaged. Each circuit will typically include numerous contact pads. To test the circuits on the wafer, it is necessary to establish a connection between electronic test equipment and the contact pads for each circuit on the wafer. Probe technology is commonly used to establish such connections.

FIGS. 1-3 illustrate a prior art probe test head for vertical probe technology. In vertical probe technology, the probes stand up vertically over the contact site, rather than approaching the contact site at an angle. The probe head consists of an array of probes between and upper die 42 and lower die 44. The upper and lower dies 42, 44 contain patterns of holes corresponding to spacing on an integrated circuit contact pad spacing which forms a lower die hole pattern and upper die hole pattern. The upper end of each of the probes is retained by the upper die hole pattern, and the lower end of each of the probes passes through the lower die hole pattern and extends beyond the lower die 44 to terminate in a probe tip. As illustrated in FIGS. 2 and 3, the lower die holes are offset from the upper die holes, and the offset is formed into each probe 101 such that the probe acts like a spring.

FIG. 4 illustrates the use of prior art vertical probes to contact solder bump arrays. Vertical probe cards, which are sometimes referred to as "buckling beam" probes, are used for testing semiconductor applications such as microprocessors, DSP's, and other advanced logic/ASIC devices that include bump arrays used as contacts for wafers in flip-chip applications (e.g., flip chips). When the test head is brought into contact with a bump 401, the upper end of the probe remains predominately stationary, while the lower end compresses into the body of the test head. One important parameter limiting the use of vertical probes is the distance between the contacts, which here is the pitch, "p", between bumps. As the contacts move closer together, or as the bumps become smaller, it becomes necessary to decrease the distance between adjacent probes. However, as described below, existing probe technologies have limitations impeding the ability to reduce such dimensions.

Another problem with existing probe technologies pertains to the assembly and repair of the probes. During assembly, each probe must be inserted into a hole in the upper and lower dies. However, some precaution must be taken to secure the probe in place. For example, if probe 101 in FIG. 3 is not secured in some manner, it may fall through the hole in the lower die. Additionally, any securing mechanism must account for the necessity of removing and replacing damaged probes. For example, it is generally undesirable to weld or solder the probes in place because such a securing technique may make removal and replacement of damaged probes unduly burdensome, time consuming, and costly.

FIGS. 5A-B illustrate one prior art probe. Probe 5000 is referred to herein as a flattened swaged probe. FIG. 5A shows one view of the probe to illustrate a prior art technique for securing the probe in a probe assembly. The probe includes a flattened swaged intermediate region 5003 (e.g., stamped) between an upper end 5001 and lower end 5005. The probe is typically formed by swaging or stamping a straight wire to produce the desired probe shape and thickness. This swaging process flattens and widens the center, curved portion of the probe in order to achieve a desired force per mil of probe deflection. As illustrated in FIG. 5B, the flattened swaged region causes the probe to have two diameters. The lower contact end has a first diameter d1, and the flattened swaged region has a diameter d2. Accordingly, when the lower contact end is inserted into a hole of a lower die, the protruding structure created by the flattened swage and having a larger diameter will create a probe stop to set the distance the probe will extend below the lower surface of the lower die and stopping the probe from sliding through the hole. However, flattened swaged probes may reduce the current handling ability of the probe in the area between the flattened region and each contact end.

FIG. 6 illustrates another prior art probe design. Probe 600 is referred to herein as a tapered probe. Tapered probe 600 include two regions of different diameters. The lower contact end of the probe to be inserted into a hole of a lower die may have a narrower diameter "d1" than an intermediate region of the probe that has a wider diameter "d2". The tapered region 601 between the lower contact end of the probe and the intermediate region of the probe ensures that the probe is secure in the assembly. The tapered region ensures that the probe does not slide through the hole in the lower die during operation. However, similar to the flattened swaged probe described above, the protruding material created by the taper impacts the spacing required between the holes of the lower die.

FIG. 7 illustrates a prior art protruding notch probe design. In this probe design, a protruding notch 701 between the lower contact end of the probe and the intermediate region extends out above or beyond a surface of the hole in the lower die thereby securing the probe. However, similar to the shortcomings of the probe designs described above, the protruding material created by the protruding notch impacts the spacing required between the holes of the lower die. Moreover, the prior art techniques for securing the probes described above can be complicated or inefficient to manufacture.

FIG. 8 illustrates another prior art probe assembly. In this example, a membrane 1301 is provided at the upper contact ends of the probes below the upper die. Such membranes are typically permanently attached by a bond. Another aspect of the present invention includes probes and assemblies that improve both the ability to replace damaged probes and repair probe assemblies and the reliability of the contacting vertical motion of the probes.

The present invention solves these and other problems with an improved probe and probe test head assembly.

SUMMARY

Embodiments of the present invention improve probes and probe assemblies. In one embodiment the present invention includes a micro probe comprising a lower contact end including a lower tip, an upper contact end, and a curved intermediate region between the upper contact end and lower contact end. An angle stop is included between the lower contact end and the curved intermediate region, and the lower contact end, upper contact end, and curved intermediate region have a uniform thickness.

In another embodiment the present invention includes a probe test head comprising a plurality of micro probes each comprising a lower contact end including a lower tip, an upper contact end, a curved intermediate region between the upper contact end and lower contact end, and an angle stop between the lower contact end and the curved intermediate region, wherein the lower contact end, upper contact end, and curved intermediate region have a uniform thickness, and a lower die comprising a first upper surface and second lower surface separated by a first thickness and a plurality of holes through the surfaces, each of said holes forming an upper rim with said first surface, wherein said curved intermediate region abuts against said rim proximate to said angle stop. In one embodiment, the probe test head further comprises an upper die comprising a third lower surface and a fourth upper surface and a plurality of holes through the surfaces, wherein the upper contact end of each probe is inserted through one of said holes.

The following detailed description and accompanying drawings provide a better understanding of the nature and advantages of the present invention.

BRIEF DESCRIPTION OF THE DRAWINGS

FIG. 4 illustrates the use of prior art vertical probes to test solder bump arrays.

FIGS. 5A-B illustrate a prior art flattened swaged probe.

DETAILED DESCRIPTION

Described herein are techniques for a micro probe apparatus and probe assembly. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
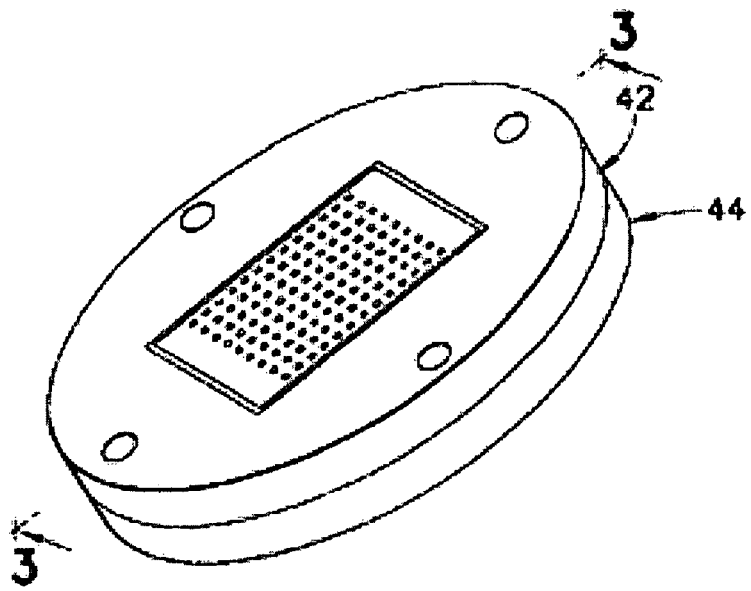
FIG. 1-3 illustrates a prior art micro-probe assembly.
Figure 2:
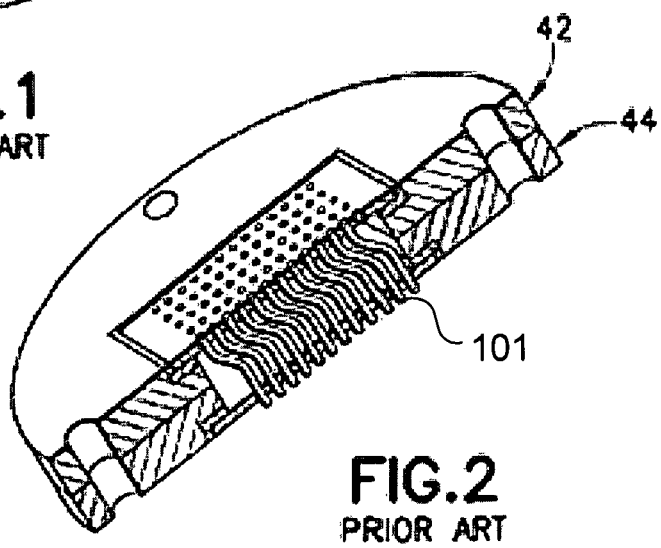
Figure 3:
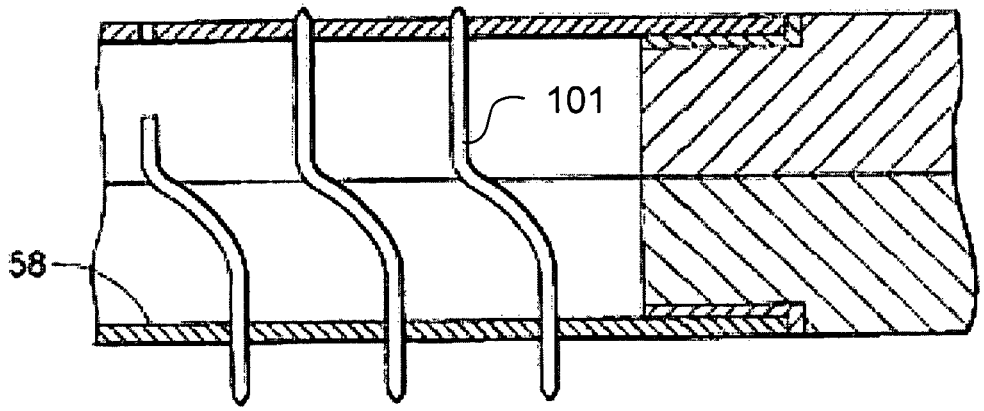
Figure 6:
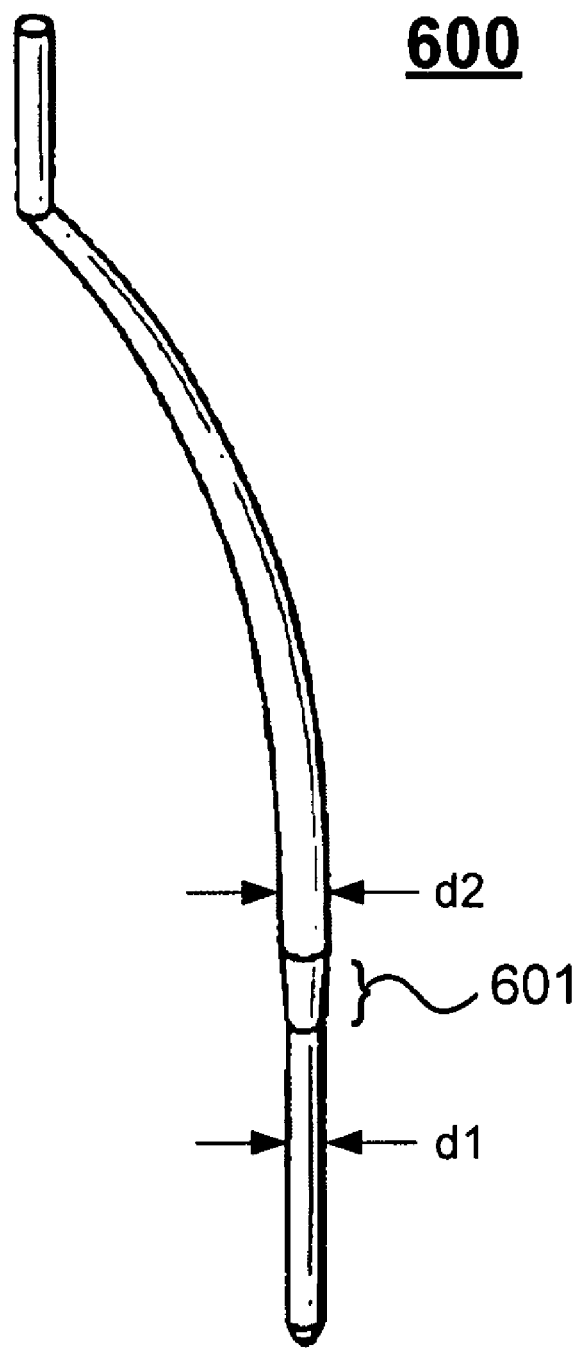
FIG. 6 illustrates a prior art tapered probe design.
Figure 7:
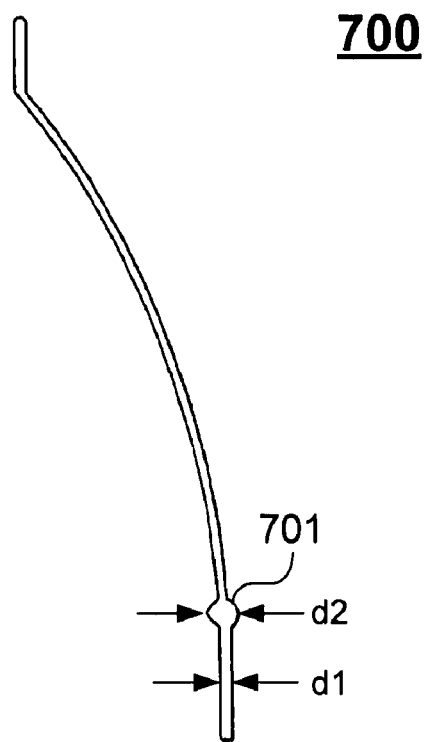
FIG. 7 illustrates a prior art protruding notch probe design.
Figure 8:
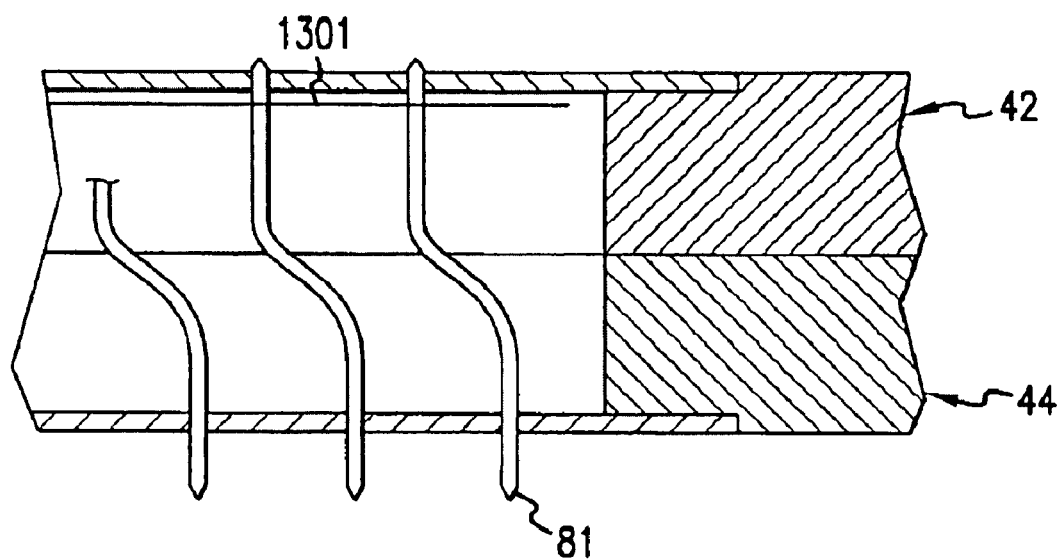
FIG. 8 illustrates another prior art probe assembly.
Figures 9A, 9B:
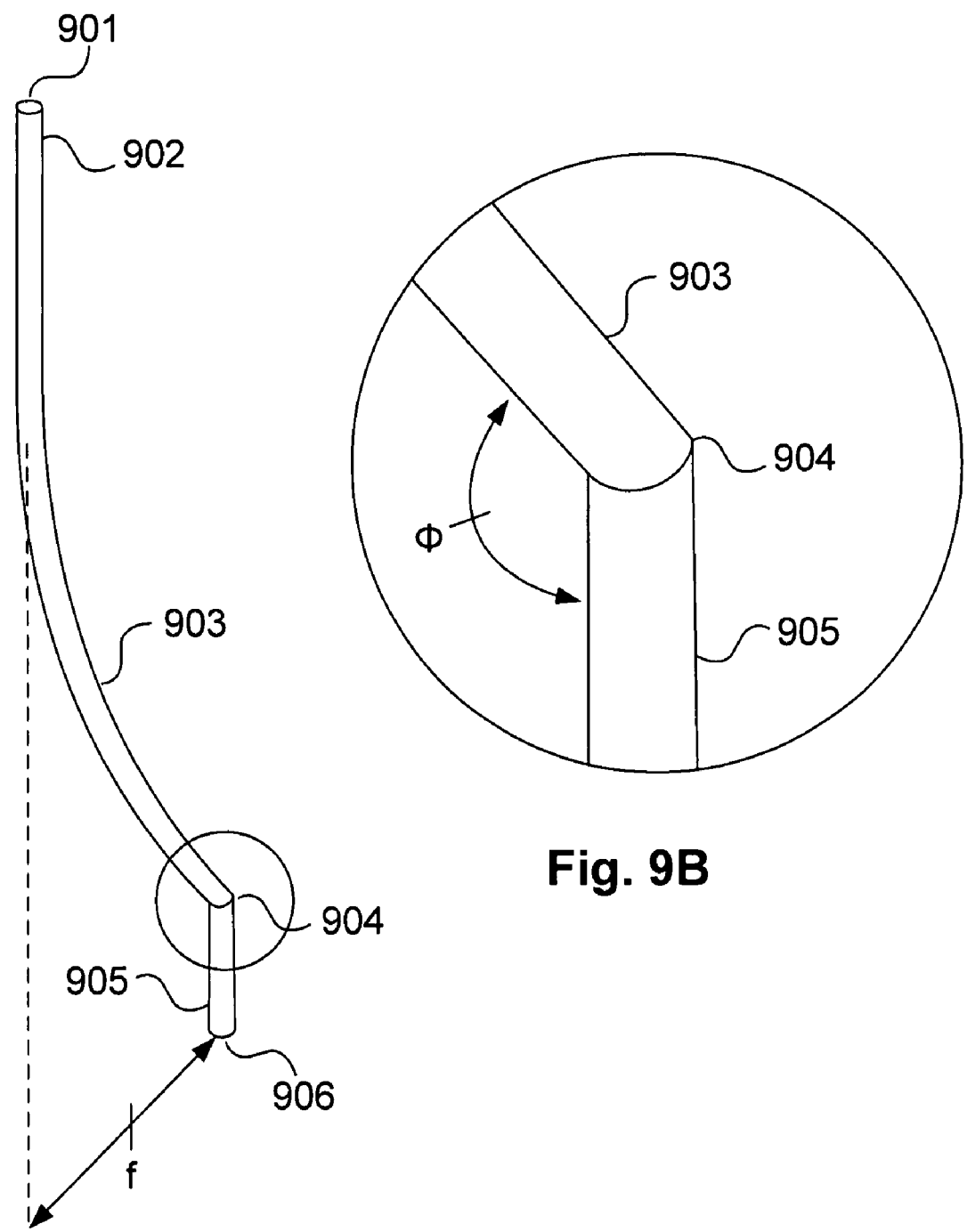
FIGS. 9A-B illustrate a micro probe according to one embodiment of the present invention.

FIG. 9A illustrates a micro probe according to one embodiment of the present invention. Micro probe 900 includes upper contact end 902 that terminates in an upper contact tip 901. In some applications, the upper contact end 902 may provide electrical contact to electronic test circuitry, for example. Micro probe 900 further includes a lower contact end 905 including a lower tip 906 which is offset a distance "f" from the upper contact end 902. In some applications, the lower tip of the lower contact end may be used for contacting a semiconductor surface, for example. Any shape of tip may be used, such as flat tips, canonical pointed tips (i.e., cone shapes), crowned tips, edge tips, or round tips, for example. Micro probe 900 further includes a curved intermediate region 903 between the upper contact end 902 and lower contact end 905. In this example the curved intermediate region is a bowed shape curve. However, it is to be understood that other curved shapes could be used. Micro probe 900 further includes an angle stop 904 between the lower contact end and the curved intermediate region 903. As illustrated in FIG. 9B, lower contact end 905 and intermediate region 903 form an obtuse angle, Φ. The probe stop angle may be formed by a sharp bend in the probe, for example, forming an abrupt angle. In one example embodiment, the lower contact end, upper contact end, and curved intermediate region may be formed from a single piece of material having a uniform thickness. Accordingly, a micro probe may be made from a single wire having substantially the same diameter by forming a curved region and angle stop, for example. As described in more detail below, angle stop 904 may be used for providing a lower insertion stop when a probe is inserted through a hole in a lower die.

Figure 10A:
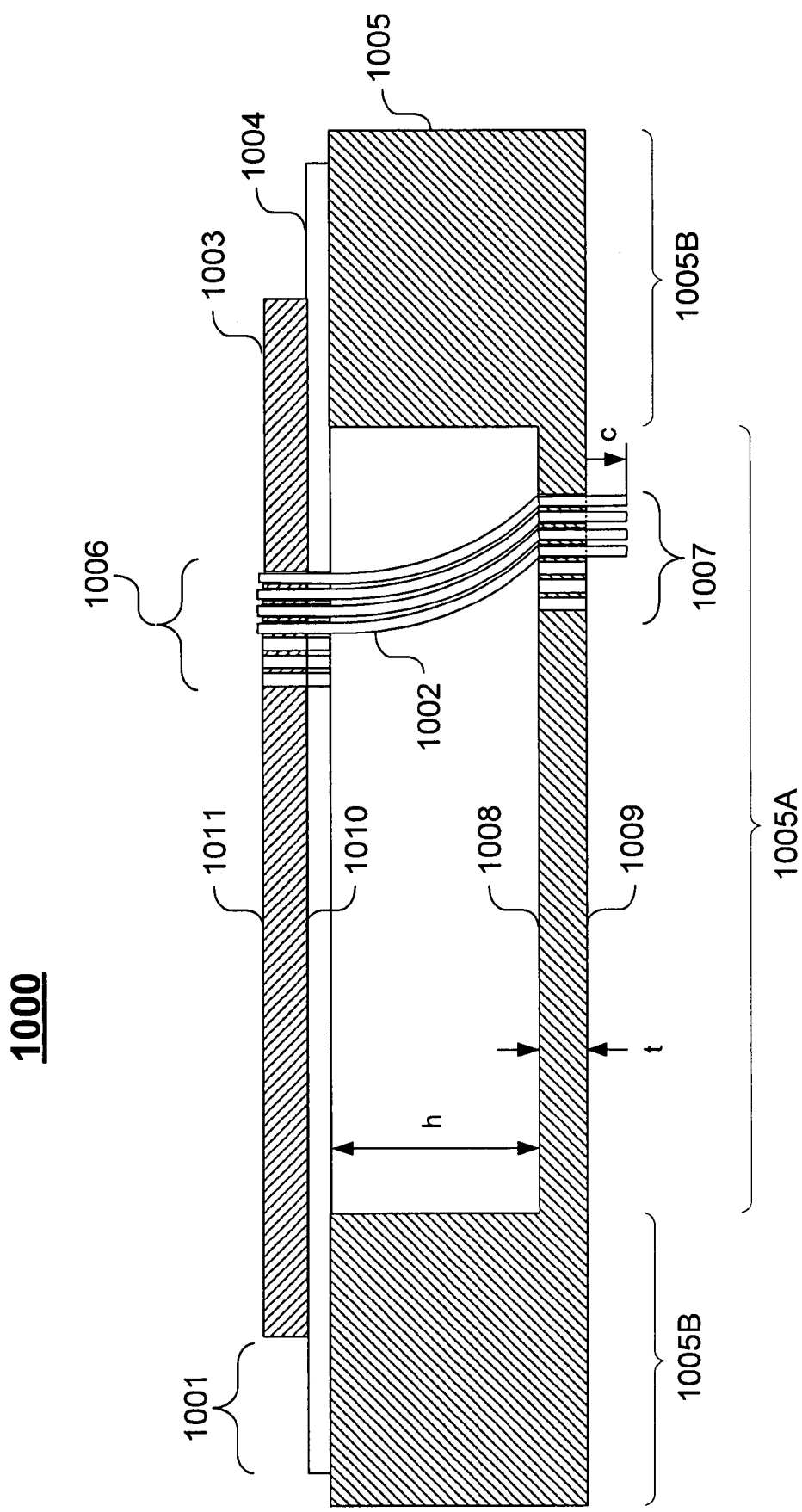
FIGS. 10A-B illustrate a probe test head according to one embodiment of the present invention.

FIG. 10A illustrates a probe test head according to one embodiment of the present invention. Probe test head 1000 includes a plurality of micro probes 1002 between a lower die 1005 and upper die 1003. A die typically includes a planar piece of material including holes for orienting the upper and lower contact ends of the micro probes. In this example, the lower die 1005 includes a recessed area 1005A to create a space between surfaces of the upper and lower die into which the probes may be inserted. The recessed area 1005A of the lower die 1005 includes a first upper planar surface 1008 and a second lower planar surface 1009 forming a thickness "t". A plurality of holes 1007 are provided through the surfaces. The thickness "t", together with the length of the lower contact ends of the plurality of micro probes, defines the vertical distance the plurality of micro probes may compress. For example, the lower contact ends of the probes extend a distance, "c" below the lower surface of the lower die. Accordingly, these probes may be compressed a maximum distance "c" before contacting the lower surface of the lower die.

In this example, the lower die further includes a vertically extended region 1005B that is raised above the recessed region by a distance "h" to make space for the probes. An alignment layer 1004 may be included across the recessed area 1005A and extending over the vertically extended region 1005B. The alignment layer may be removably fixed to an upper surface of the extended region 1005B. In one embodiment describe below, a second recessed area may be provided in the lower die so that the alignment layer is flush with the upper surface of the vertically extended region 1005B so that the alignment layer may be removably fixed to the upper surface using tape, for example.

Probe test head 1000 further includes an upper die 1003 having a third lower planar surface 1010, a fourth upper planar surface 1011, and a plurality of holes 1006 which are used to orient the upper contact end of the plurality of micro probes 1002 for electrical contact to test electronics. The intermediate alignment layer 1004 below upper die 1003 has a plurality of holes matching the plurality of holes 1006 in the upper die. This intermediate layer allows the plurality of micro probes to be temporarily oriented with, or aligned to, the upper die. In one embodiment, the intermediate layer may extend laterally beyond the upper die to create an exposed region (i.e., a tab). An example of a tab is shown by the bracket labeled 1001. These extensions allow for the intermediate layer to be removably attached to the lower die without requiring a permanent adhesive or bond, for example, between the intermediate layer and the upper surface of the vertically extended region of the lower die.

Figure 10B:
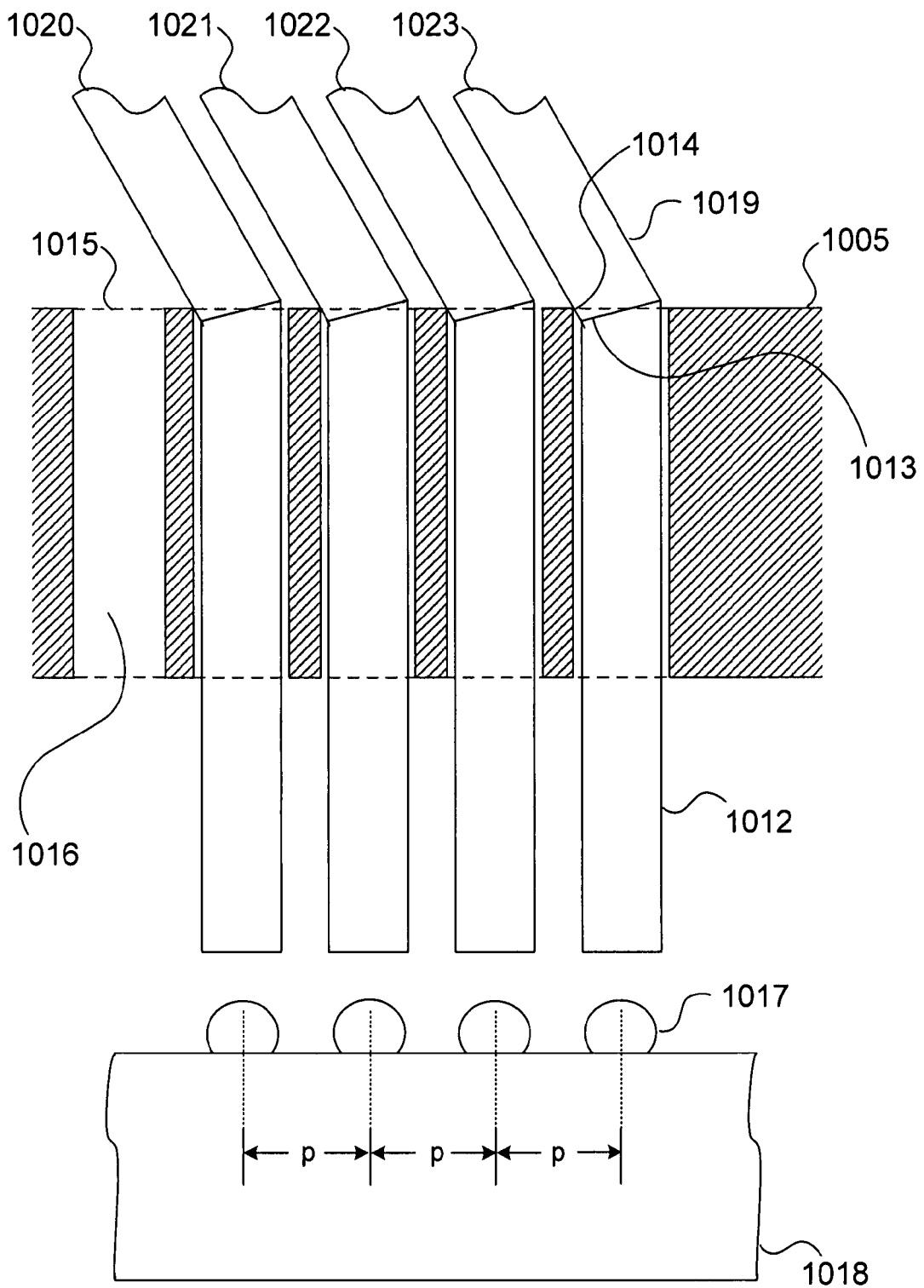

FIG. 10B further illustrates the embodiment of FIG. 10A. This figure shows a close up view of the plurality of micro probes in the lower die. This figure illustrates a lower die section 1005, an example hole 1016, an example upper rim 1015 indicated with a dashed line, an example flip chip section 1018 having an example bump 1017, and a plurality of micro probes 1020-1023. Each micro probe has a section of a curved intermediate region 1019, an angle stop 1013 and a lower contact end 1012 extending below the lower surface of the lower die. FIG. 10B shows the micro probes in an uncompressed condition (i.e., the lower tips are not in contact with the bumps 1017). FIG. 10B illustrates that the micro probes may be inserted into the holes 1016 and that the angle stop 1013 on each probe will control the distance between the lower surface of the lower die and the lower tip of each probe. For example, the holes 1016 in lower die 1005 form an upper rim 1015 with the upper planar surface of the lower die. When a micro probe is inserted into one of the holes 1015, the curved intermediate region of the probe abuts against the rim proximate to said angle stop as illustrated at 1014, thereby stopping the probe from continuing through the hole. Therefore, the distance between the angle stop and the probe tip, together with the thickness of the lower die holes, will set the distance between the lower plane of the lower die and the tip of the probe. Additionally, since the micro probes are have a uniform thickness, the probes can be arranged in a tight array with a reduced distance "p" between probes for flip chips that have a small pitch between their bumps. This is one advantage of the microprobes and probe test heads described herein. For example, prior art probes required protruding structures at the upper rim of the lower die holes, such as tapers, flattened swages, or protruding notches, to act as a probe stop. These protruding structures extended over the rim of each hole and set a minimum pitch of the prior art probes. Reducing the pitch required reducing the diameter of each hole and the corresponding probe to allocate space for the required protruding structure. However, since the micro probes according to the present invention do not require tapered regions, flatten swages, or protruding notches to act as a probe stop, these micro probes may have an increased thickness for any given pitch because the holes and corresponding probes may be made larger for a given pitch. This advantage also has the benefit of increasing the current handling capacity of the probe. In other words, because larger probes can be used for a given pitch, the probes will be able to carry more current.

Figure 11:
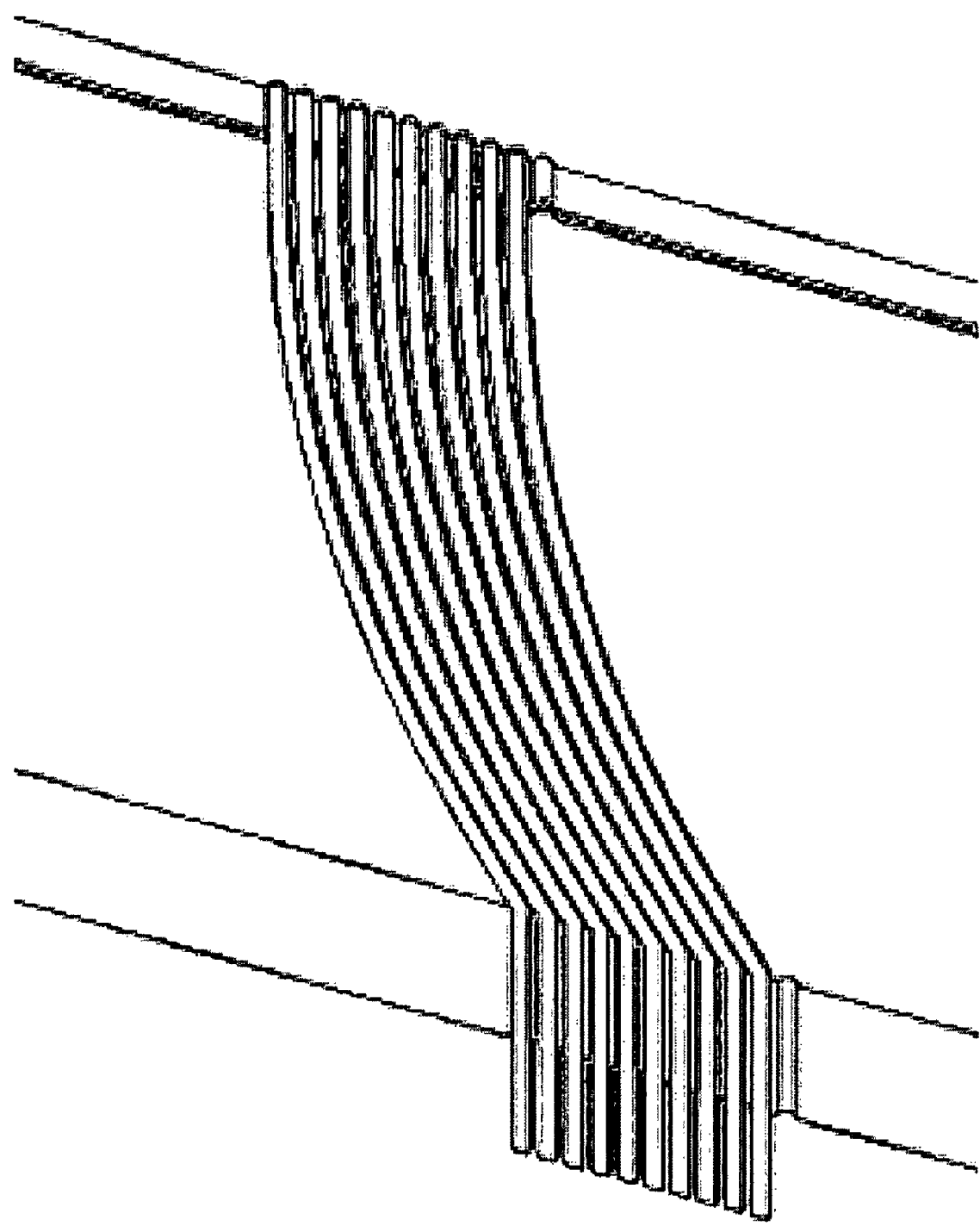
FIG. 11 illustrates a probe test head according to another embodiment of the present invention.

FIG. 11 illustrates a probe test head according to another embodiment of the present invention. In this cross section of a probe test head, the plurality of micro probes may not extend above the upper planar surface of the upper die when the plurality of micro probes are in there uncompressed condition. In particular, the tip of the upper contact end of each probe is below the upper surface of the upper die if the tip of the lower contact end is disengaged. This has the advantage of having the probes recessed below the upper surface of the upper die during mounting of the probe test head to the test electronics, thereby protecting the probes from damage due to lateral impacts during mounting. Also the probes are in a substantially relaxed state while the probe test head is mounted to the test electronics and while the lower contact ends of the plurality of micro probes are essentially disengaged from a device under test. This may extend the life of the micro probes by limiting the time when the micro probes are compressed to the time the test head is engaged to the device under test.

Figure 12A:
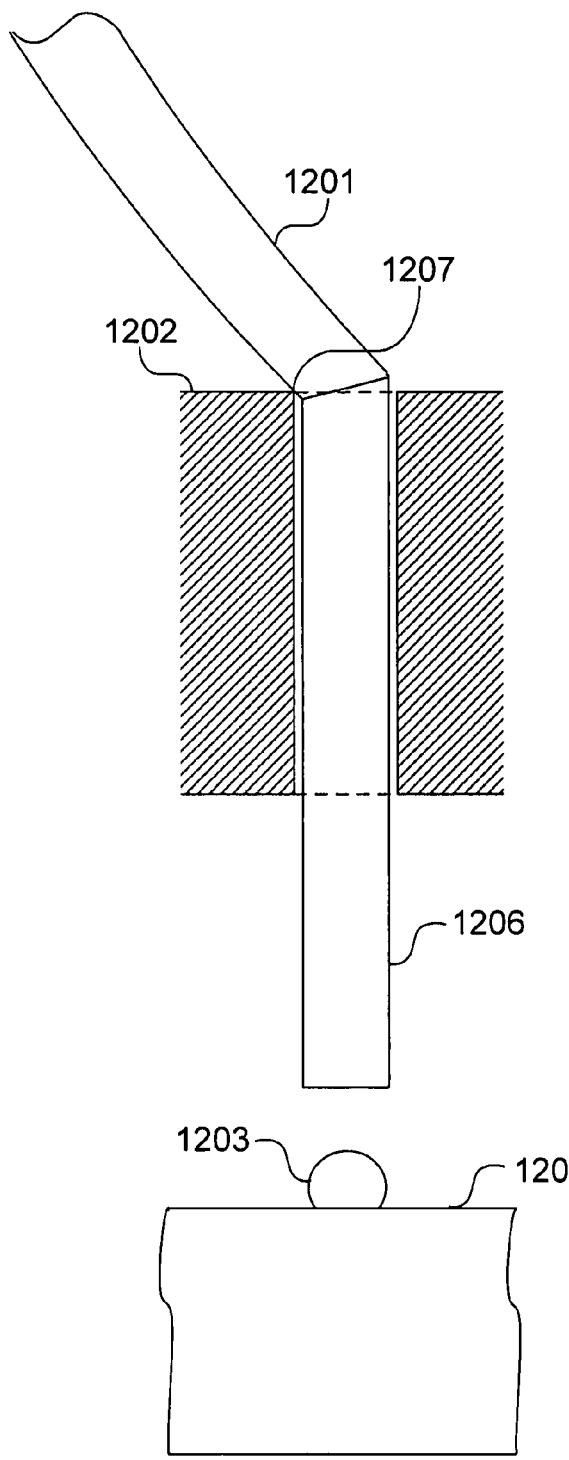
FIGS. 12A-B illustrate the actuation of a micro probe within a probe test head.
Figure 12B:
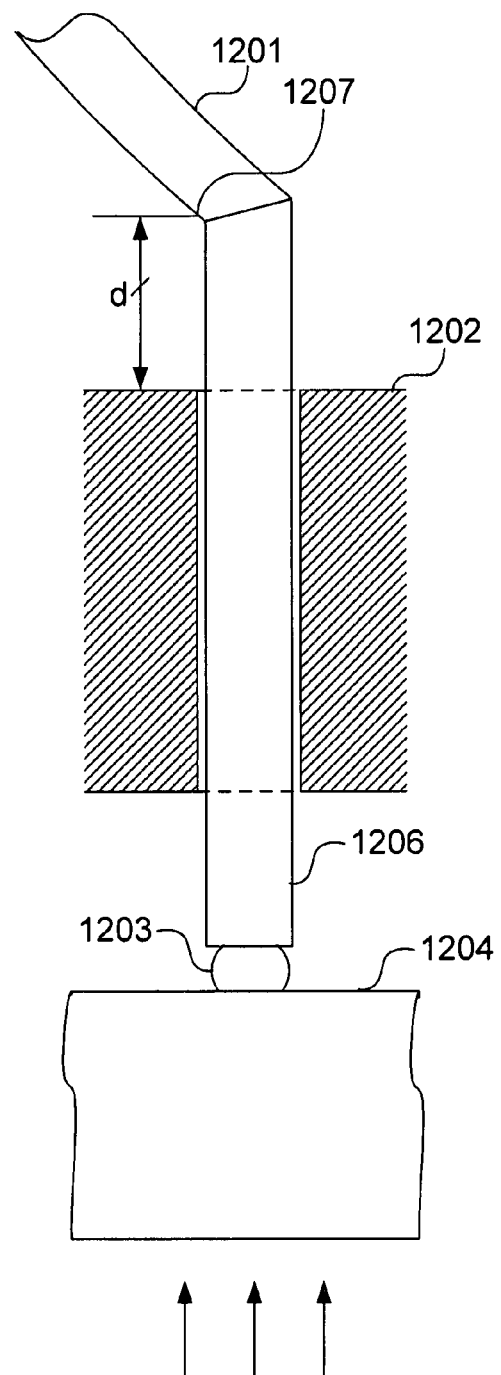

FIGS. 12A and 12B illustrates the actuation of a micro probe within a probe test head as the device under test 1204 moves vertically so that a micro bump 1203 engages the tip of the lower contact end 1206. FIG. 12A shows a micro probe in an uncompressed condition. The bump 1203 of a section of a flip chip 1204 is not in contact with the tip of the lower contact end 1206 of the micro probe, and therefore the micro probe is considered to be disengaged. While disengaged, location 1207 on the curved intermediate region of the probe abuts against the upper rim of the hole of the lower die near the angle stop preventing any further extension downward of the lower contact end of the micro probe. FIG. 12B shows the vertical movement of the device under test. First, the bump contacts the tip of the lower contact end 1206 of the micro probe. Then, the further upward vertical motion of the device under test causes the lower contact end to move up through the guide hole in the lower die, thereby flexing the curved intermediate region which increases the corresponding gram force the micro probe exerts on the bump. This actuation displaces point 1207 a distance "d" which corresponds substantially to the vertical displacement of the lower tip of the micro probe caused by the movement of the bump. As mentioned above, embodiments of the present invention may allow for the use of thicker probes for a given pitch. This has the additional advantage of increasing the gram force (or spring force) of the probe. This increased gram force may increase the indent made by the tip of the lower contact end when it comes into contact with the bump, thereby increasing the contact area of the tip to the bump and improving the contact. Additionally, the gram force of the probe can be changed by making the probe with a different offset distance, "s" shown in FIG. 9A.

Figure 13A:
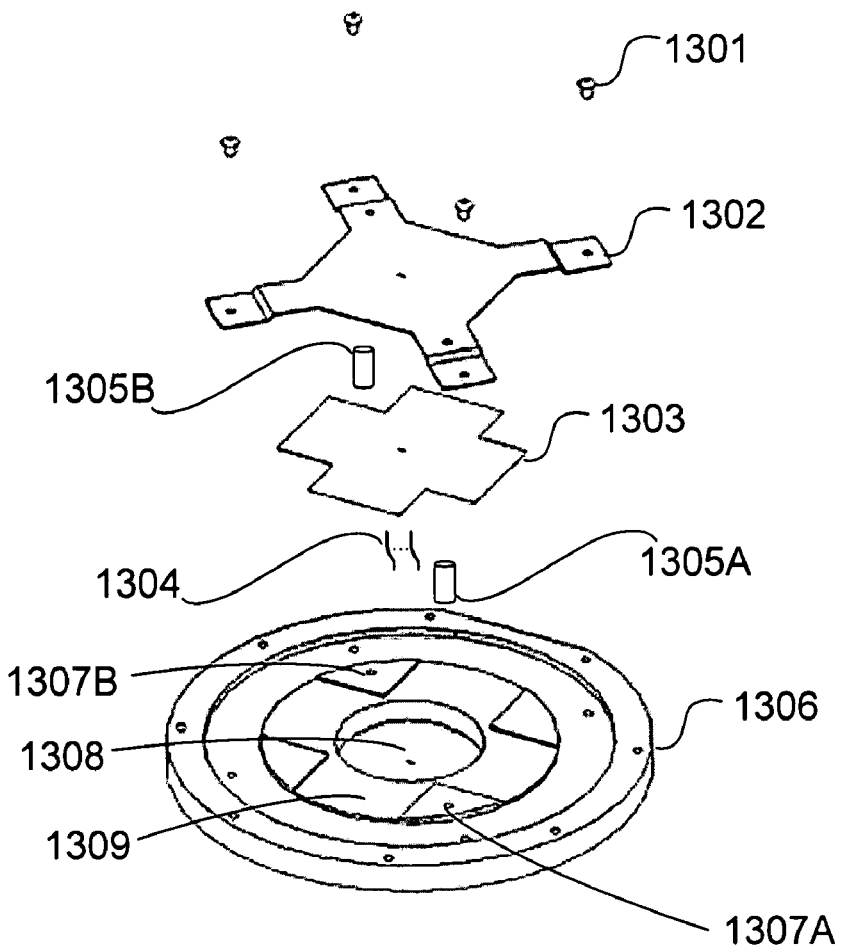
FIGS. 13A-B illustrate an example assembly according to another embodiment of the present invention.
Figure 13B:
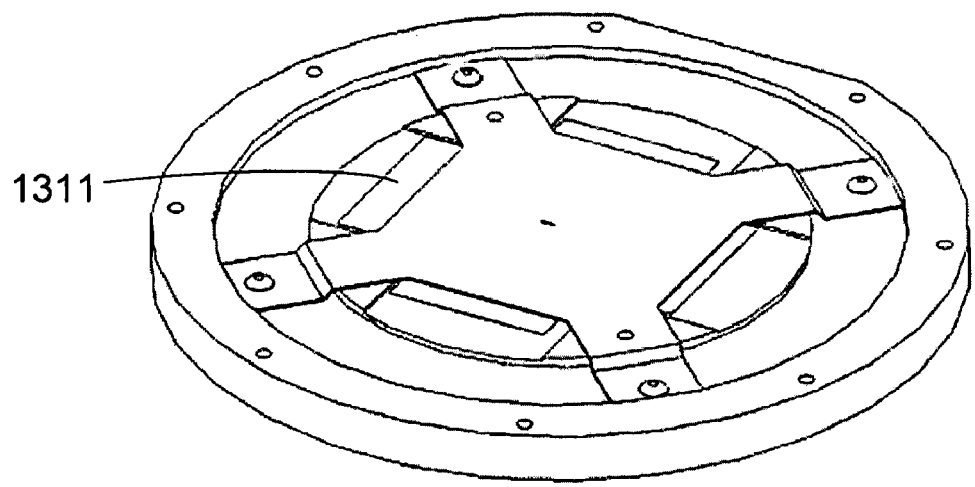

FIGS. 13A and 13B illustrate another embodiment of the present invention. FIG. 13A shows an exploded view of the assembly of a probe test head, and FIG. 13B shows an assembled view of the probe test head. This example assembly includes a lower die 1306, alignment layer 1303, and upper die 1302. The lower die includes a first recessed area 1308. Recessed area 1308 includes a plurality of lower die holes described above. The lower contact end of each micro probe 1304 may be inserted through the holes in lower die 1306. Angle stops on each probe cause the probe to contact the rim of each hole to act as a probe stop. Alignment layer 1303 also includes a plurality of holes for receiving the upper contact end of each probe. In some embodiments, lower die 1306 may further include a second recessed layer 1309 for receiving the alignment layer 1303. Upper die 1302 includes a plurality of holes corresponding to the alignment layer. The upper die 1302 is placed on top of the alignment layer and lower die as illustrated in FIG. 13B and attached, for example, using screws.

For example, during assembly, the lower contact end of a plurality of micro probes may be inserted through the holes in the lower die. Next, a first row of the upper contact ends of the plurality of micro probes may be inserted into the corresponding holes of the intermediate layer. Then each successive row maybe inserted in succession until the entire upper contact ends of the plurality of micro probes are inserted into the intermediate layer. The intermediate layer may be located within a recessed area 1309 of the lower die 1306. Next, the upper die may then be attached over the alignment layer. The upper die may be oriented by guide pins 1305A-B, for example. In one embodiment, the alignment layer may include some elasticity. The elasticity of the alignment layer allows the assembler to position the plurality of micro probes in line with the plurality of holes in the upper die. Finally, the upper die may be attached to the lower die to hold the assembly together, for example, using screws. This results in a complete probe test head.

When the lower die, probes, alignment layer, and upper die are assembled, exposed regions 1311 of the alignment layer may protrude from under the upper die. Accordingly, the alignment layer may be attached to the lower die by taping down the exposed regions 1311, for example, before the upper die is attached or if the upper die is removed to replace a probe. For example, if the upper die is removed, micro probes may be removed and reinserted through the intermediate alignment layer, lower contact end of the probe first, and then inserted into a corresponding hole in the lower die. The other probes around the removed probe will act to guide the replacement probe into place. Additionally, after the test head is assembled, the tape may be removed allowing the intermediate layer to float and simply be held laterally in place by the upper contact ends of the plurality of probes. This allows the probes to be unencumbered by the intermediate layer, and provides for a more reliable vertical motion and contact. Accordingly, embodiments of the invention improve both the ability to replace damaged probes and repair probe assemblies and the reliability of the contacting vertical motion of the probes.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims. The terms and expressions that have been employed here are used to describe the various embodiments and examples. These terms and expressions are not to be construed as excluding equivalents of the features shown and described, or portions thereof, it being recognized that various modifications are possible within the scope of the appended claims.

What is claimed is:

1. A test assembly comprising:
   a plurality of micro probes, wherein one of said micro probes includes only one angle stop connected to a linear region and a curved region, wherein said linear region is shorter than said curved region, wherein said linear region includes a first contact end configured for providing electrical contact to a solder bump on a semiconductor wafer, wherein said curved region includes a second contact end configured for providing electrical contact to an electronic test circuitry, wherein said linear and curved regions have a uniform thickness;
   a first planar board having a plurality of holes formed therein, wherein one of said holes is configured for receiving said curved region of said one micro probe; and
   a second planar board having a plurality of holes formed therein, wherein one of said holes is configured for receiving said linear region of said one micro probe at said angle stop.

2. The test assembly of claim 1, wherein said curved region is in a bowed shape.

3. The test assembly of claim 1, wherein said angle stop is an obtuse angle.

4. The test assembly of claim 1, wherein said angle stop forms a sharp bend.

5. The test assembly of claim 1, wherein said micro probe is made of a single piece of material.

* * * * *